(12) United States Patent
Derderian et al.

(10) Patent No.: US 7,898,017 B2
(45) Date of Patent: Mar. 1, 2011

(54) FLOATING-GATE MEMORY CELL AND MEMORY DEVICE AND ELECTRONIC SYSTEM THEREWITH

(75) Inventors: Garo Derderian, Boise, ID (US); Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 968 days.

(21) Appl. No.: 11/600,357

(22) Filed: Nov. 16, 2006

(65) Prior Publication Data

US 2007/0063259 A1 Mar. 22, 2007

Related U.S. Application Data

(62) Division of application No. 10/932,795, filed on Sep. 2, 2004, now Pat. No. 7,390,710.

(51) Int. Cl.
*H01L 29/788* (2006.01)
(52) U.S. Cl. .................. 257/316; 257/315; 257/E29.3; 438/429
(58) Field of Classification Search .......... 257/315, 257/E29.3, 316; 438/222, 218, 221, 413, 438/429
See application file for complete search history.

(56) References Cited

U.S. PATENT DOCUMENTS

| | | | |
|---|---|---|---|
| 5,250,461 A | 10/1993 | Sparks | |
| 5,641,694 A | 6/1997 | Kenney | |
| 6,180,486 B1 | 1/2001 | Leobandung | |
| 6,545,297 B1 | 4/2003 | Noble, Jr. | |
| 6,631,086 B1 * | 10/2003 | Bill et al. | 365/185.09 |
| 6,635,543 B2 | 10/2003 | Furukawa | |
| 2005/0009295 A1 | 1/2005 | Chan | |

FOREIGN PATENT DOCUMENTS

KR 2002001021 * 1/2002

* cited by examiner

*Primary Examiner*—Matthew C Landau
*Assistant Examiner*—Candice Y Chan
(74) *Attorney, Agent, or Firm*—Leffert Jay & Polglaze, P.A.

(57) ABSTRACT

A floating-gate memory cell has a tunnel dielectric layer that overlies a silicon-containing semiconductor substrate and that is adjacent a trench formed in the semiconductor substrate. A floating-gate layer, having at least one silicon-containing layer, overlies the tunnel dielectric layer. An intergate dielectric layer overlies the floating-gate layer, and a control gate layer overlies the intergate dielectric layer. A first silicon oxide layer is formed on an edge of the at least one silicon-containing layer of the floating-gate layer and extends across a first portion of an edge of the tunnel dielectric layer. A second silicon oxide layer is formed on a sidewall of the trench and extends across a second portion of the edge of the tunnel dielectric layer.

19 Claims, 8 Drawing Sheets

FLOATING-GATE MEMORY CELL AND MEMORY DEVICE AND ELECTRONIC SYSTEM THEREWITH

RELATED APPLICATION

This application is a divisional application of U.S. application Ser. No. 10/932,795, titled "PROTECTION OF TUNNEL DIELECTRIC USING EPITAXIAL SILICON," filed Sep. 2, 2004, now U.S. Pat. No. 7,390,710 which application is assigned to the assignee of the present invention and the entire contents of which are incorporated herein by reference.

TECHNICAL FIELD OF THE INVENTION

The present invention relates generally to semiconductor memory devices, and in particular, the present invention relates to the protection of tunnel dielectric layers in the fabrication of memory cells.

BACKGROUND OF THE INVENTION

Memory devices are typically provided as internal storage areas in the computer. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as Flash memory. A flash memory is a type of EEPROM (electrically-erasable programmable read-only memory) that can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating-gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

Flash memory typically utilizes one of two basic architectures known as NOR flash and NAND flash. The designation is derived from the logic used to read the devices. In NOR flash architecture, a column of memory cells are coupled in parallel with each memory cell coupled to a bit line. In NAND flash architecture, a column of memory cells are coupled in series with only the first memory cell of the column coupled to a bit line.

Isolation is typically required or desired between rows or columns of memory cells. This isolation often takes the form of shallow trench isolation (STI). STI generally involves forming a trench between adjacent rows or columns of memory cells and filling the trench with a dielectric material. However, for trenches formed adjacent a tunnel dielectric layer of a floating-gate memory cell, the tunnel dielectric layer may be damaged by oxidation of the fill material. This damage often takes the form of "smiles" formed at the edges of the tunnel dielectric layer, effectively reducing the gate width of the device. Additionally, an etch-back of the fill material in a two-step fill process may also damage the tunnel dielectric layer by removing exposed portions at the edges of the tunnel dielectric layer.

For the reasons stated above, and for other reasons stated below which will become apparent to those skilled in the art upon reading and understanding the present specification, there is a need in the art for alternative memory device structures and methods of forming memory devices.

DETAILED DESCRIPTION OF THE INVENTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer and substrate used previously and in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the appended claims and equivalents thereof.

Figure 1:
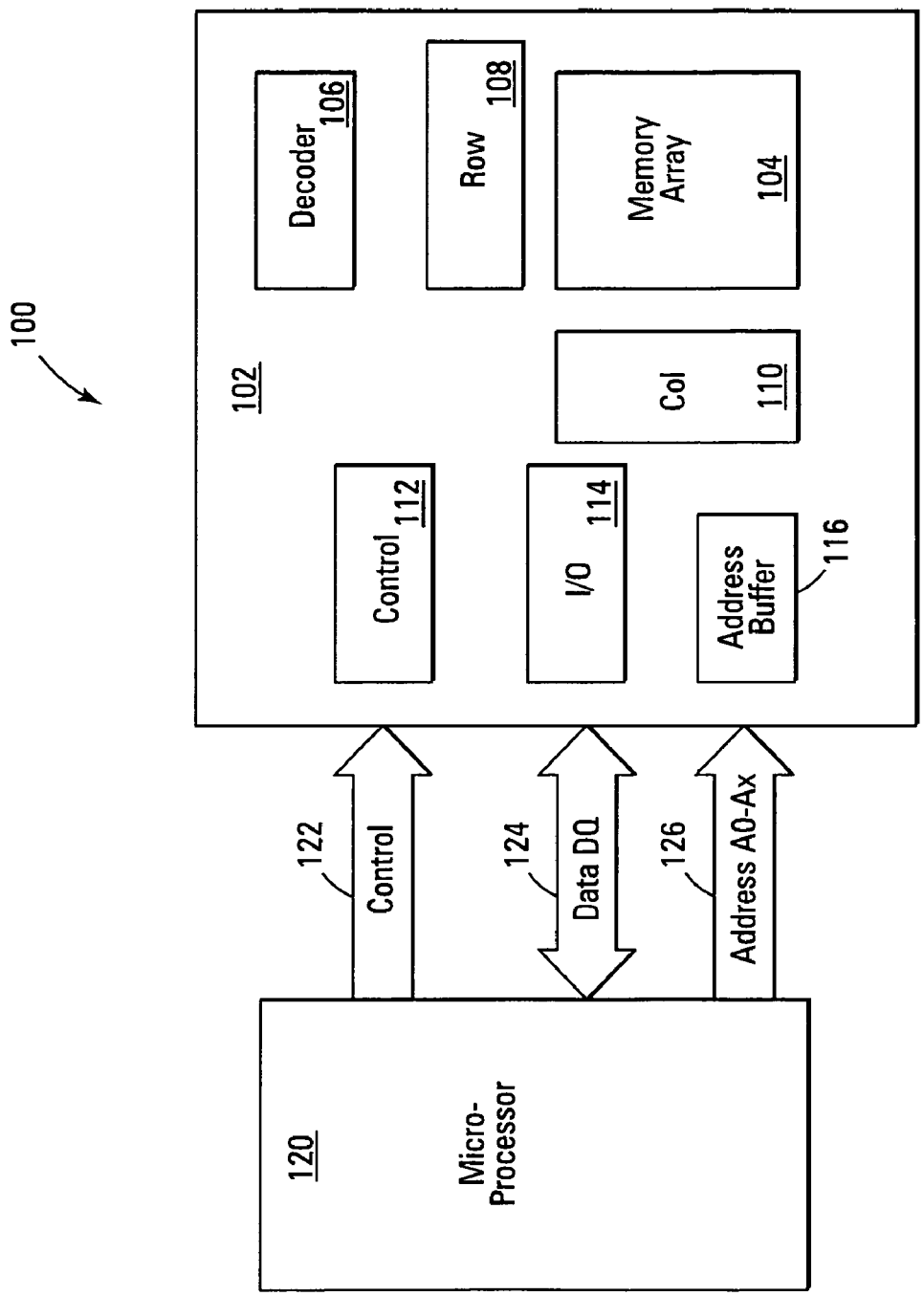
FIG. 1 is a simplified block diagram of a memory system in accordance with an embodiment of the invention.

FIG. 1 is a simplified block diagram of a memory system 100, according to an embodiment of the invention. Memory system 100 includes an integrated circuit flash memory device 102, e.g., a NAND memory device, that includes an array of floating-gate memory cells 104, an address decoder 106, row access circuitry 108, column access circuitry 110, control circuitry 112, Input/Output (I/O) circuitry 114, and an address buffer 116. Memory system 100 includes an external microprocessor 120, or memory controller, electrically connected to memory device 102 for memory accessing as part of an electronic system. The memory device 102 receives control signals from the processor 120 over a control link 122. The memory cells are used to store data that are accessed via a data (DQ) link 124. Address signals are received via an address link 126 that are decoded at address decoder 106 to access the memory array 104. Address buffer circuit 116 latches the address signals. The memory cells are accessed in response to the control signals and the address signals. It will be appreciated by those skilled in the art that additional circuitry and control signals can be provided, and that the memory device of FIG. 1 has been simplified to help focus on the invention. The memory array 104 includes isolation regions and/or memory cells formed in accordance with the invention.

Figure 2:
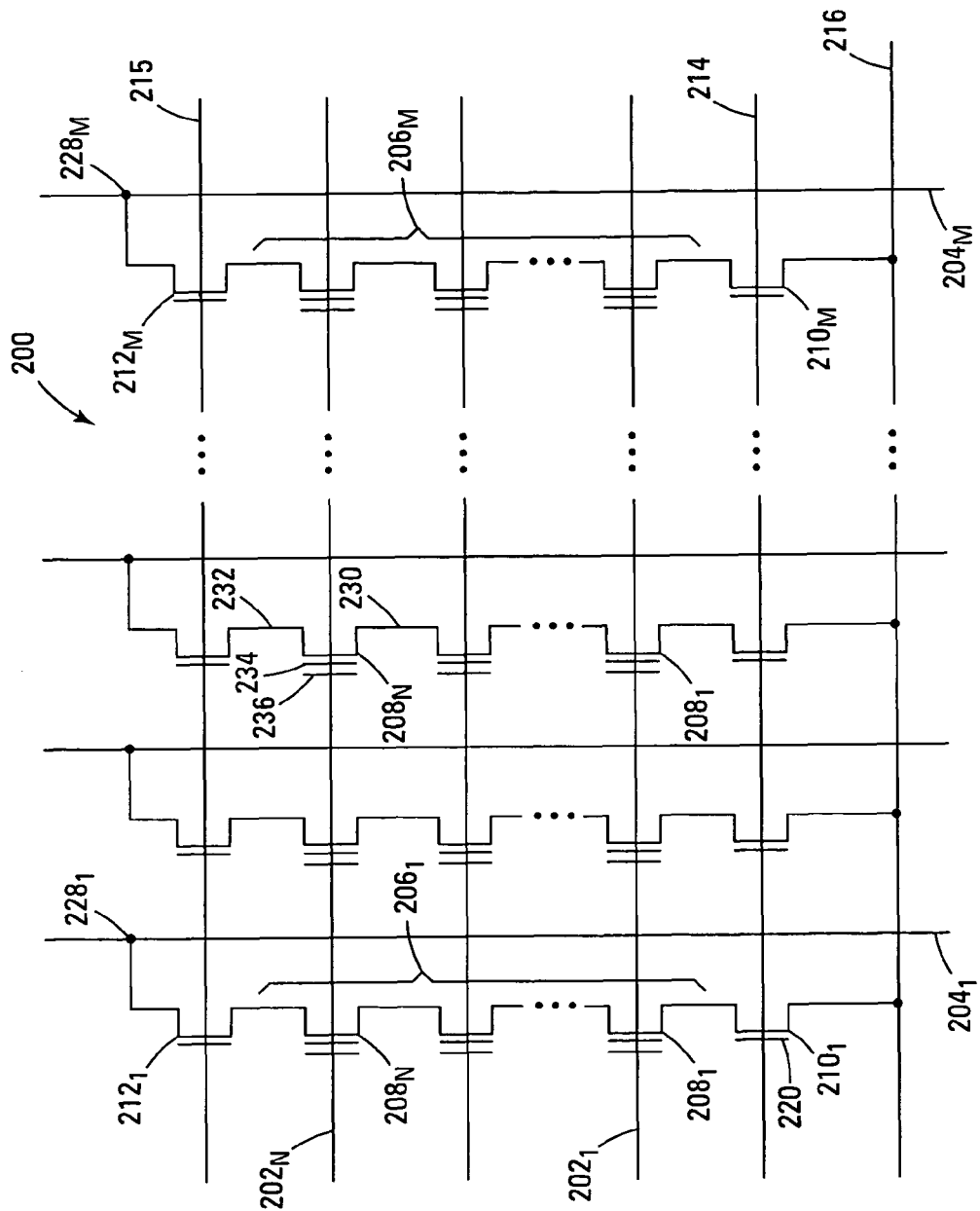
FIG. 2 is a schematic of a NAND memory array in accordance with an embodiment of the invention.

FIG. 2 is a schematic of a NAND memory array 200 as a portion of memory array 104 of FIG. 1 in accordance with another embodiment of the invention. As shown in FIG. 2, the memory array 200 includes word lines $202_1$ to $202_N$ and intersecting local bit lines $204_1$ to $204_M$. For ease of addressing in the digital environment, the number of word lines 202 and the number of bit lines 204 are each some power of two, e.g., 256 word lines 202 by 4,096 bit lines 204. The local bit lines 204 are coupled to global bit lines (not shown) in a many-to-one relationship.

Memory array 200 includes NAND strings $206_1$ to $206_M$. Each NAND string includes floating-gate transistors $208_1$ to $208_N$, each located at an intersection of a word line 202 and a local bit line 204. The floating-gate transistors 208 represent non-volatile memory cells for storage of data. The floating-gate transistors 208 of each NAND string 206 are connected in series source to drain between a source select gate 210, e.g., a field-effect transistor (FET), and a drain select gate 212, e.g., an FET. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. A control gate 220 of each source select gate 210 is connected to source select line 214.

The drain of each drain select gate 212 is connected to a local bit line 204 for the corresponding NAND string at a drain contact 228. For example, the drain of drain select gate $212_1$ is connected to the local bit line $204_1$ for the corresponding NAND string $206_1$ at drain contact $228_1$. The source of each drain select gate 212 is connected to the drain of the last floating-gate transistor 208 of the corresponding NAND string 206. For example, the source of drain select gate $212_1$ is connected to the drain of floating-gate transistor $208_N$ of the corresponding NAND string $206_1$.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of the floating-gate transistors 208 are those NAND strings 206 coupled to a given local bit line 204. A row of the floating-gate transistors 208 are those transistors commonly coupled to a given word line 202.

Figure 3:
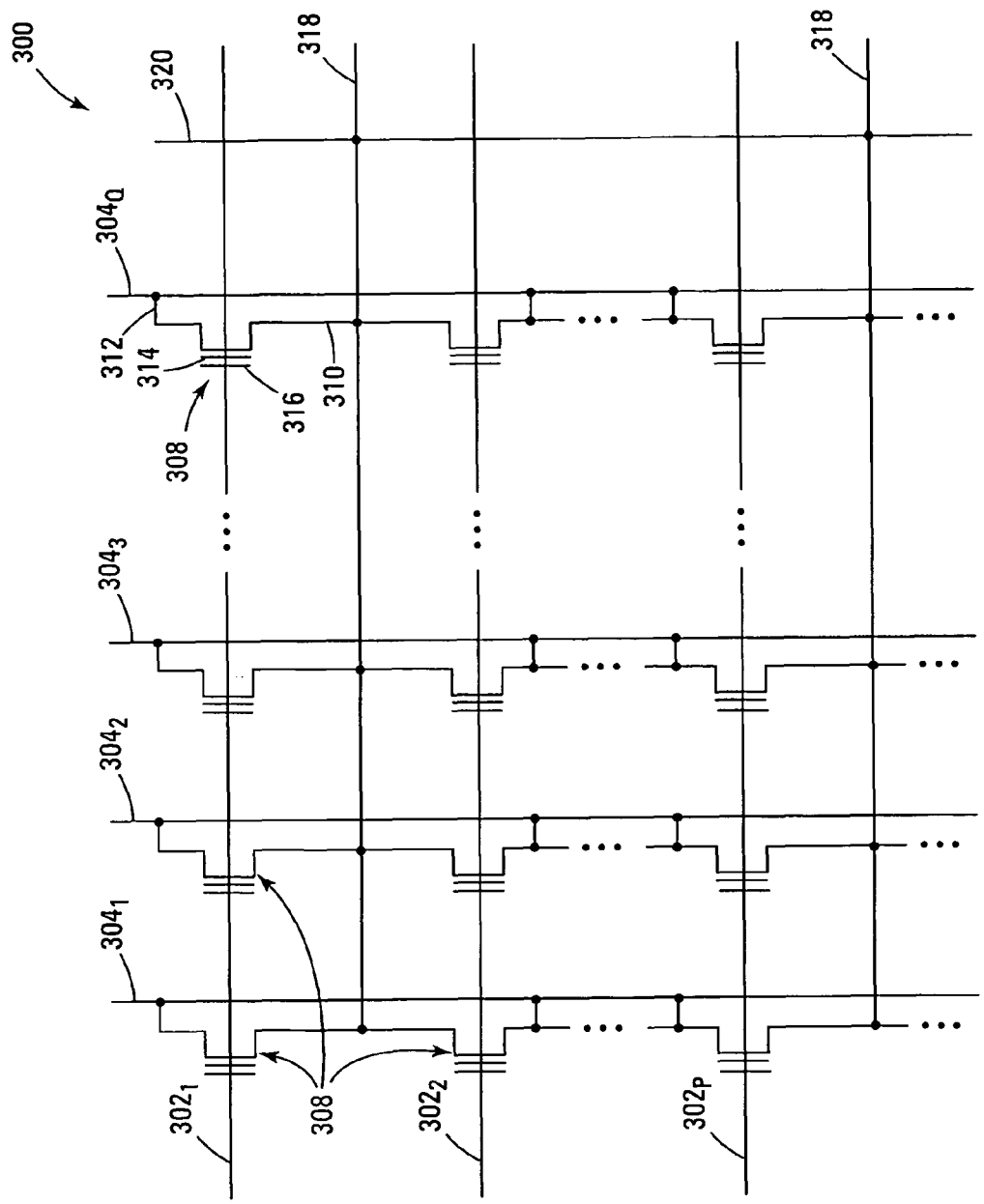
FIG. 3 is a schematic of a NOR memory array in accordance with an embodiment of the invention.

FIG. 3 is a schematic of a NOR memory array 300 as a portion of memory array 104 of FIG. 1 in accordance with another embodiment of the invention. Memory array 300 includes word lines $302_1$ to $302_P$ and intersecting local bit lines $304_1$ to $304_Q$. For ease of addressing in the digital environment, the number of word lines 302 and the number of bit lines 304 are each some power of two, e.g., 256 word lines 302 by 4,096 bit lines 304. The local bit lines 304 are coupled to global bit lines (not shown) in a many-to-one relationship.

Floating-gate transistors 308 are located at each intersection of a word line 302 and a local bit line 304. The floating-gate transistors 308 represent non-volatile memory cells for storage of data. Typical construction of such floating-gate transistors 308 includes a source 310 and a drain 312, a floating gate 314, and a control gate 316.

Floating-gate transistors 308 having their control gates 316 coupled to a word line 302 typically share a common source depicted as array source 318. As shown in FIG. 3, floating-gate transistors 308 coupled to two adjacent word lines 302 may share the same array source 318. Floating-gate transistors 308 have their drains 312 coupled to a local bit line 304. A column of the floating-gate transistors 308 includes those transistors commonly coupled to a given local bit line 304. A row of the floating-gate transistors 308 includes those transistors commonly coupled to a given word line 302.

To reduce problems associated with high resistance levels in the array source 318, the array source 318 is regularly coupled to a metal or other highly conductive line to provide a low-resistance path to ground. The array ground 320 serves as this low-resistance path.

Figure 4A:
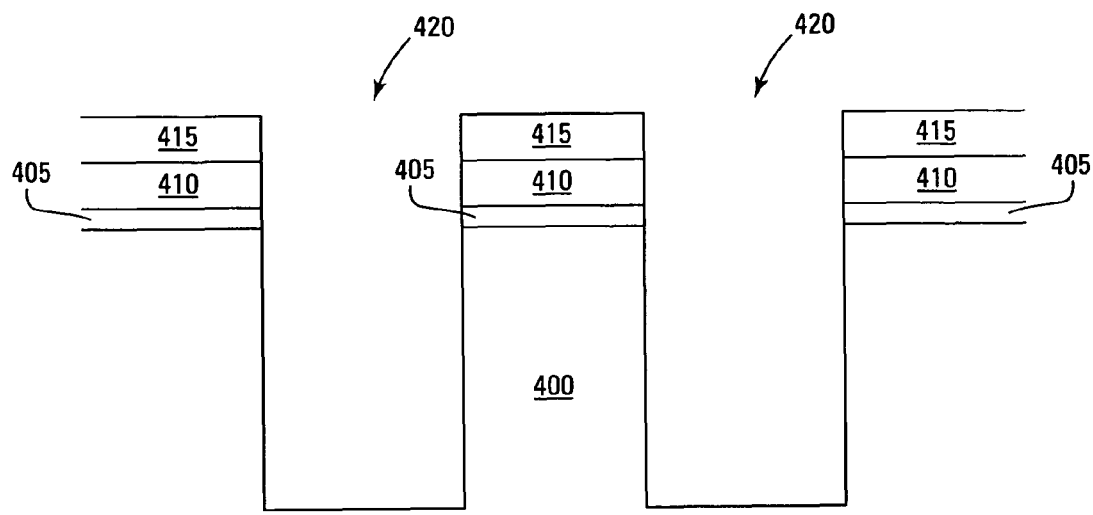
FIGS. 4A-4E are cross-sectional views of a portion of a memory array at various stages of fabrication in accordance with one embodiment of the invention.

FIGS. 4A-4E generally depict a method of forming a portion of a memory array in accordance with one embodiment of the invention. FIG. 4A depicts a portion of the memory array after several processing steps have occurred. Formation of the type of structure depicted in FIG. 4A is well known and will not be detailed herein. In general, FIG. 4A depicts a silicon-containing substrate 400 upon which tunnel dielectric layer 405, a silicon-containing layer 410 and a hard mask layer 415 have been formed. For one embodiment, the substrate 400 is a monocrystalline silicon substrate. For a further embodiment, substrate 400 is a P-type monocrystalline silicon substrate. The silicon-containing layer 410 is preferably a polysilicon (polycrystalline silicon) layer, but could also include other forms of doped or undoped silicon materials, such as monocrystalline silicon, nanocrystalline silicon and amorphous silicon. For convenience, the silicon-containing layer 410 will be referred to as polysilicon layer 410 in the following description.

The tunnel dielectric layer 405 is formed overlying an active region of the substrate 400, over which memory cells will be formed. Isolation regions 420 are formed in the substrate 400. For the embodiment as shown in FIG. 4A, the isolation regions are shallow-trench isolation (STI) regions, commonly formed by creating a trench in the substrate 400 and filling the trench with a dielectric material. The isolation regions 420 would generally be formed after forming the layers 405, 410 and 415. Typical process for forming isolation regions 420 could utilize photolithographic processing including depositing, exposing and developing a photoresist material to define areas for the isolation regions 420, and then removing the layers 405, 410 and 415, as well as a portion of the substrate 400, in those areas.

The tunnel dielectric layer 405 might be formed by thermal oxidation of the silicon substrate 400. Alternatively, the tunnel dielectric layer 405 could be formed by a blanket deposition of a dielectric material, such as by chemical vapor deposition (CVD) or physical vapor deposition (PVD). Tunnel dielectric layer 405 is generally a silicon oxide, but may include other dielectric materials.

The polysilicon layer 410 may be used to form a portion of a floating-gate layer for the future floating-gate memory cells. The polysilicon layer 410 may be conductively doped either during or after formation. The hard mask layer 415 is formed overlying the polysilicon layer 410 to protect its upper surface during subsequent processing. In general, hard mask layer 415 is of a material that will be substantially resistant to formation of epitaxial silicon. For one embodiment, the hard mask layer 415 is a silicon nitride material.

Figure 4B:
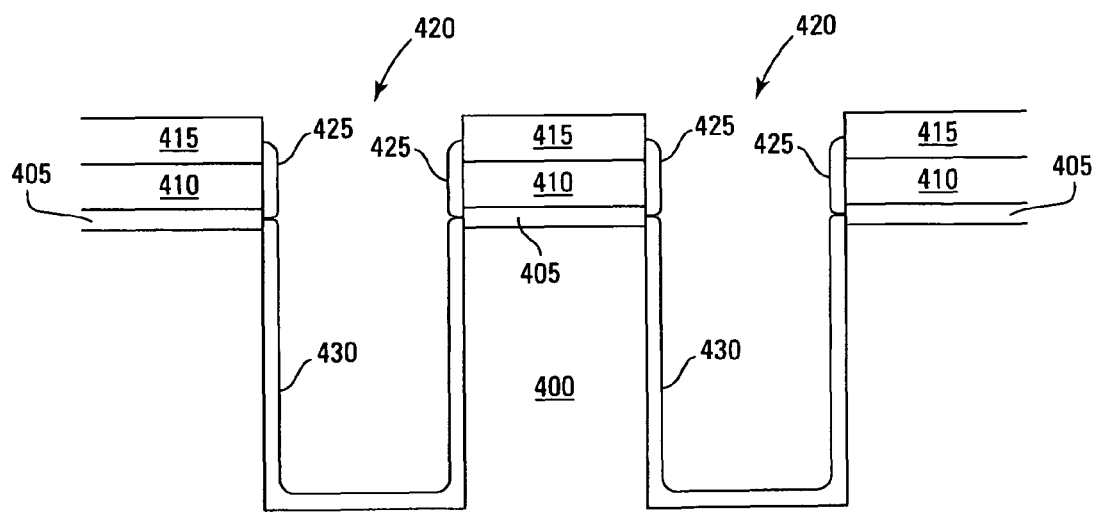

In FIG. 4B, epitaxial silicon layers 425 and 430 are formed. Epitaxial silicon growth will be selective to areas of exposed silicon, such as the exposed portions of the substrate 400 and the polysilicon layer 410. Such selective growth will produce the layers of epitaxial silicon 425 and 430 on the polysilicon layer 410 and substrate 400, respectively. Because the epitaxial silicon growth will occur both horizontally and vertically, the layers of epitaxial silicon 425 and 430 will grow across the edges of the tunnel dielectric layer 405. In this manner, the thickness of growth of the layers of epitaxial silicon 425 and 430 need only be approximately one-half the thickness of the tunnel dielectric layer 405 in order to completely cover the edges.

Epitaxial deposition of silicon is a chemical vapor deposition (CVD) process. The process will replicate the structure of the silicon material upon which it is formed. For example, if the base structure is of monocrystalline silicon, the epitaxial growth will maintain the same monocrystalline structure. Similarly, if the base structure is of polycrystalline silicon (polysilicon), the epitaxial growth will likewise be polysilicon. Silicon precursors are transported to, and adsorbed on, the exposed silicon structures. Common silicon precursors for the production of epitaxial silicon include silicon tetrachloride ($SiCl_4$), trichlorosilane ($SiHCl_3$), dichlorosilane ($SiH_2Cl_2$) and silane ($SiH_4$).

The process of epitaxial silicon growth is well understood in the art. Typical deposition temperatures range from about 600° C. to about 1250° C. Thickness of the epitaxial growth is typically controlled through reaction time, or time that the silicon structures are exposed to the reactant gases and their reaction conditions. Typical reaction times may range from about 1 minute to about 15 minutes or more, depending upon the desired depth of deposition.

Selective epitaxial deposition occurs when silicon atoms having high surface mobility are deposited from the silicon source or precursor. These silicon atoms migrate to sites on exposed silicon structures, where nucleation is favored. Others have observed that silicon mobility is enhanced by the presence of halides in the reaction gases. Other factors recognized to enhance the selective nature of the silicon deposition include reduced reaction pressure, increased reaction temperature and decreased mole fraction of silicon in the reaction gases.

Figure 4C:
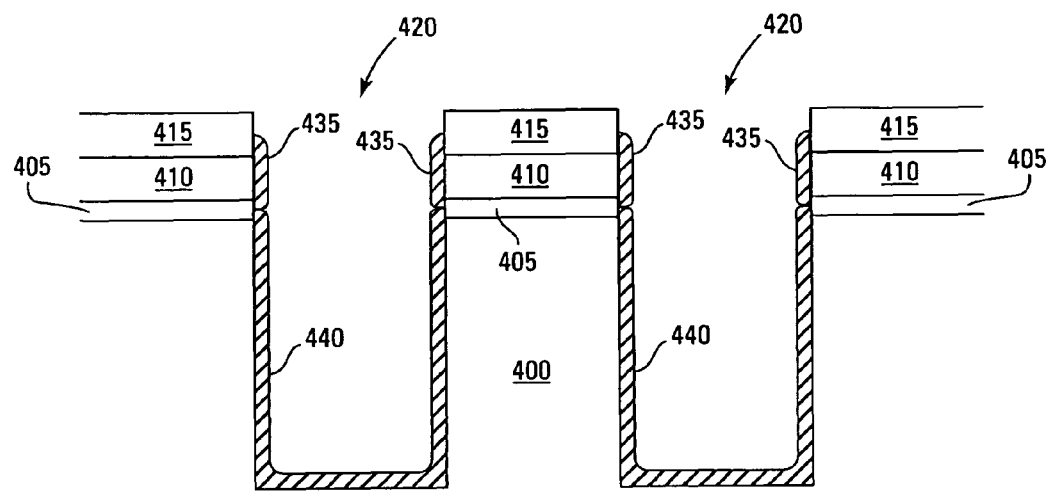

In FIG. 4C, the layers of epitaxial silicon 425 and 430 are oxidized, such as by thermal oxidation, to form layers of silicon oxide 435 and 440, respectively. Because the layers of epitaxial silicon 425 and 430 were formed to cover the edges of the tunnel dielectric layer 405, oxidation of the tunnel dielectric layer 405 will be limited in comparison to an oxidation of the exposed portions of the substrate 400 in the isolation regions 420 had the layers of epitaxial silicon 425 and 430 not been present.

Figure 4D:
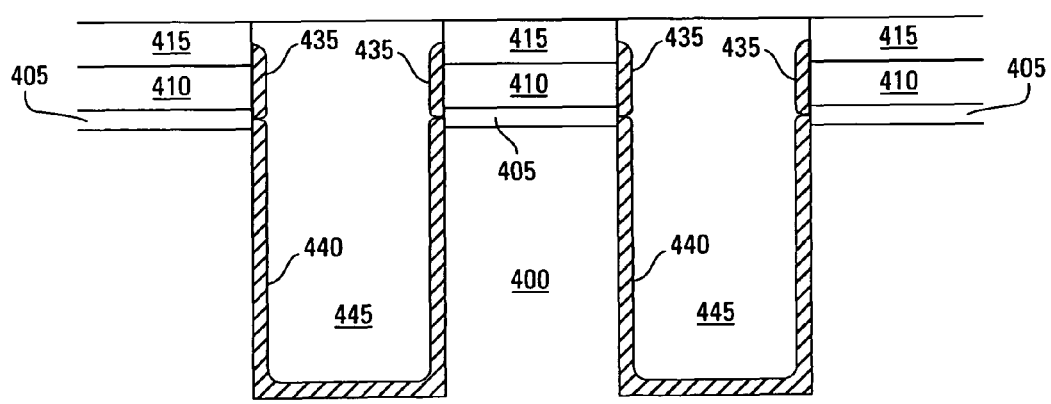

In FIG. 4D, the isolation regions 420 are filled with a dielectric material or dielectric fill layer 445, e.g., a high-density plasma (HDP) oxide material, spin-on dielectric (SOD) material or other dielectric fill. If necessary, a portion of the dielectric fill layer 445 may be removed, such as by chemical-mechanical planarization (CMP) to obtain the structure as shown in FIG. 4D. Because the layers of epitaxial silicon 425 and 430 can be formed at very low thicknesses, e.g., if the tunnel dielectric layer is 80 Å, the epitaxial growth can be as low as 40 Å, and because the layers of epitaxial silicon 425 and 430 are not formed at the top of the isolation regions 420, the layers of epitaxial silicon 425 and 430 do not significantly impact the ability to fill the isolation regions 420 with dielectric material.

Figure 4E:
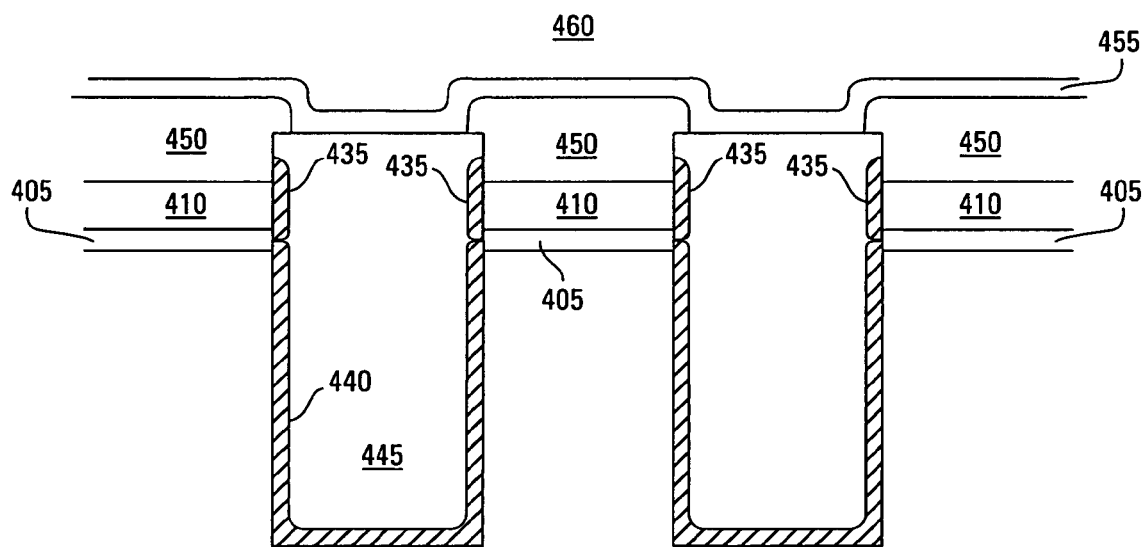

In FIG. 4E, the fabrication of the memory cells can be completed using techniques well understood in the art. While the polysilicon layer 410 may be used as a floating-gate layer of a floating-gate memory cell, it is generally desirable to increase its volume as well as its coupling area. As such, a second polysilicon layer 450 may optionally be formed overlying the polysilicon layer 410, with the polysilicon layer 410 and second polysilicon layer 450 collectively forming the floating-gate layer of a memory cell. An intergate dielectric layer 455 is then formed overlying this floating-gate layer. The intergate dielectric layer 455 may be one or more layers of dielectric material. For example, the intergate dielectric layer 455 could be of a multi-layer dielectric material commonly referred to as ONO (oxide-nitride-oxide). Other dielectric materials may be substituted for the ONO, such as tantalum oxide, barium strontium titanate, silicon nitride and other materials providing dielectric properties.

The control gate layer 460 is formed overlying the intergate dielectric layer 456 and patterned to define word lines of the memory device. The control gate layer 460 is generally one or more layers of conductive material. For one embodiment, the control gate layer 460 contains a conductively-doped polysilicon. For a further embodiment, the control gate layer 460 includes a metal-containing layer overlying a polysilicon layer, e.g., a refractory metal silicide layer formed on a conductively-doped polysilicon layer. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals. For another embodiment, the control gate layer 460 contains multiple metal-containing layers, e.g., a titanium nitride (TiN) barrier layer overlying the intergate dielectric layer 456, a titanium (Ti) adhesion layer overlying the barrier layer and a tungsten (W) layer overlying the adhesion layer. An insulative cap layer (not shown) is often formed overlying the control gate layer 460 to protect and isolate the control gate from further processing.

It is noted that FIGS. 4A-4E depict a portion of a row of memory cells running parallel to a face plane of the drawings. Columns of memory cells, separated by the isolation regions 420 run perpendicular to the drawings, with source and drain regions formed at opposing ends of the tunnel dielectric layer 405, one above the face plane of the figures and one below the face plane of the figures. It is noted that FIGS. 4A-4E can depict either a NOR-type memory device or a NAND-type memory device, with the differences occurring in the column direction in manners that are well understood in the art of memory fabrication.

Figure 5A:
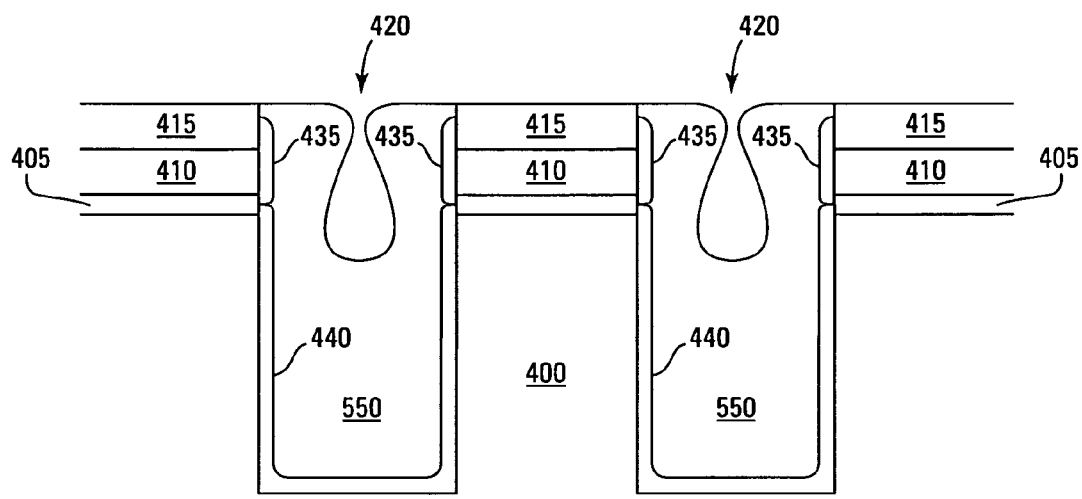
FIGS. 5A-5C are cross-sectional views of a portion of a memory array at various stages of fabrication in accordance with another embodiment of the invention.
Figure 5B:
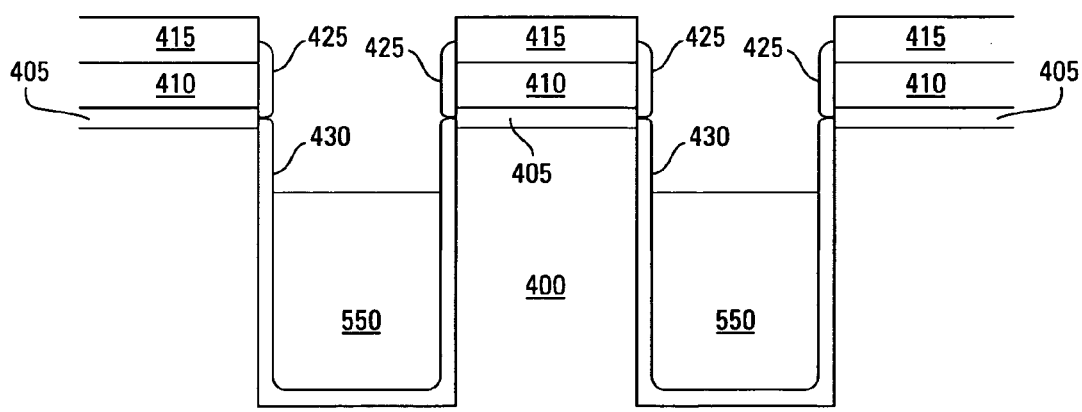
Figure 5C:
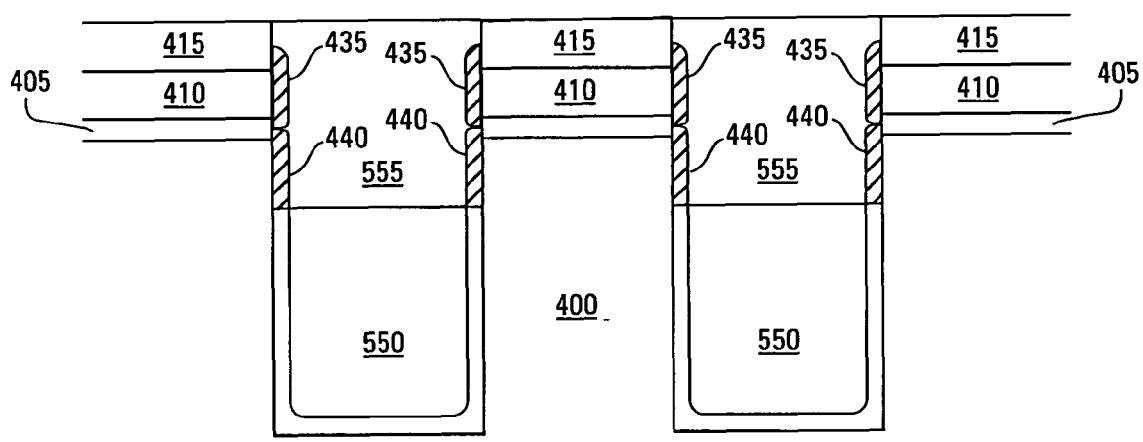

FIGS. 5A-5C generally depict a method of forming a portion of a memory array in accordance with another embodiment of the invention. The method described with reference to FIGS. 5A-5C is useful for processes requiring a two-step fill process. In particular, for trenches having high aspect ratios (depth/width), undesirable voids may be formed in the trench due to pinch-off at the top of the trench during the formation of the dielectric fill material. To rectify this situation, the top portion of the fill layer is often removed, such as by a wet etch, to expose or remove the void. This results in a trench having a lower aspect ratio, allowing the trench to be filled during the formation of a second layer of dielectric fill material. While silicon oxide layers can be protected during the removal of a silicon oxide fill material by first lining the trench with a silicon nitride material, this solution is undesirable in floating-gate memory cells as the silicon nitride liner acts as a charge trapping layer and can interfere with the reliability of the floating-gate device.

FIG. 5A depicts a portion of the memory array after several processing steps have occurred. Formation of the type of structure depicted in FIG. 5A can proceed generally as described with reference to FIGS. 4A-B. However, instead of oxidizing the layers of epitaxial silicon 425 and 430 as described with reference to FIG. 4C, the isolation regions 420 are filled with a dielectric material or first dielectric fill layer 550, e.g., a high-density plasma (HDP) oxide material, spin-on dielectric (SOD) material or other dielectric fill, without oxidizing the layers of epitaxial silicon 425 and 430.

In FIG. 5B, an upper portion of the first dielectric fill layer 550 is removed, such as by an etch-back process. The removal process is chosen to be selective to the removal of the first dielectric fill layer 550 over the removal of epitaxial silicon. For example, using a silicon oxide fill material, a wet etch containing HF (hydrofluoric acid) can be used to remove an exposed portion of the silicon oxide material without significantly affecting the layers of epitaxial silicon 425 and 430.

In FIG. 5C, the isolation regions 420 are filled with a dielectric material or second dielectric fill layer 555, e.g., a high-density plasma (HDP) oxide material, spin-on dielectric (SOD) material or other dielectric fill. The second dielectric fill layer 555 may contain the same dielectric material or a different dielectric material than the first dielectric fill layer 550. Portions of the layers of epitaxial silicon 425 and 430 exposed following the removal of a portion of the first dielectric fill layer 550 should be oxidized either before, or concurrently with, the formation of the second dielectric fill layer 555. If necessary, a portion of the second dielectric fill layer 555 may be removed, such as by chemical-mechanical planarization (CMP) to obtain the structure as shown in FIG. 5C. Further processing to form memory cells can occur as generally described with reference to FIG. 4E.

CONCLUSION

Layers of epitaxial silicon are used to protect the tunnel dielectric layer of a floating-gate memory cell from excessive oxidation or removal during the formation of shallow trench isolation (STI) regions. Following trench formation, the layers of epitaxial silicon are grown from silicon-containing layers on opposing sides of the tunnel dielectric layer, thereby permitting their thickness to be limited to approximately one-half of the thickness of the tunnel dielectric layer. The epitaxial silicon may be oxidized prior to filling the trench with a dielectric material or a dielectric fill may occur prior to oxidizing at least the epitaxial silicon covering the ends of the tunnel dielectric layer.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A floating-gate memory cell, comprising:
   a tunnel dielectric layer overlying a silicon-containing semiconductor substrate and adjacent a trench formed in the semiconductor substrate;
   a floating-gate layer overlying the tunnel dielectric layer, wherein the floating-gate layer comprises at least one silicon-containing layer;
   an intergate dielectric layer overlying the floating-gate layer;
   a control gate layer overlying the intergate dielectric layer;
   a first silicon oxide layer formed on an edge of the at least one silicon-containing layer of the floating-gate layer and extending across a first portion of an edge of the tunnel dielectric layer; and
   a second silicon oxide layer formed on a sidewall of the trench and extending across a second portion of the edge of the tunnel dielectric layer;
   wherein the first and second silicon oxide layers are two distinct layers; and
   wherein the first and second silicon oxide layers are in contact with the tunnel dielectric layer.

2. The floating-gate memory cell of claim 1, wherein the tunnel dielectric layer comprises a silicon oxide layer.

3. The floating-gate memory cell of claim 1, wherein the at least one silicon-containing layer is a first polysilicon layer formed overlying and adjoining the tunnel dielectric layer.

4. The floating-gate memory cell of claim 3, wherein the floating-gate layer further comprises a second polysilicon layer overlying and adjoining the first polysilicon layer.

5. A floating-gate memory cell, comprising:
   a tunnel oxide layer overlying a silicon-containing semiconductor substrate and positioned between two isolation trenches formed in the semiconductor substrate;
   a floating-gate layer overlying the tunnel oxide layer, wherein the floating-gate layer comprises at least one polysilicon layer;
   an intergate dielectric layer overlying the floating-gate layer;
   a control gate layer overlying the intergate dielectric layer;
   layers of oxidized epitaxial polysilicon formed on opposing edges of the at least one polysilicon layer of the floating-gate layer and extending across a first portion of opposing edges of the tunnel oxide layer; and
   layers of oxidized epitaxial monocrystalline silicon formed on sidewalls of the trenches and extending across a second portion of the opposing edges of the tunnel oxide layer;
   wherein the layers of oxidized epitaxial polysilicon are distinct from the layers of oxidized epitaxial monocrystalline silicon; and
   wherein the layers of oxidized epitaxial polysilicon are in contact with the tunnel oxide layer and the layers of oxidized epitaxial monocrystalline silicon are in contact with the tunnel oxide layer.

6. A memory device, comprising:
   an array of floating-gate memory cells; and
   circuitry for control and/or access of the array of floating-gate memory cells;
   wherein the at least one memory cell of the array of floating-gate memory cells comprises:
      a tunnel dielectric layer overlying a silicon-containing semiconductor substrate and adjacent a trench formed in the semiconductor substrate;
      a floating-gate layer overlying the tunnel dielectric layer, wherein the floating-gate layer comprises at least one silicon-containing layer;
      an intergate dielectric layer overlying the floating-gate layer;
      a control gate layer overlying the intergate dielectric layer;

a first silicon oxide layer formed on an edge of the at least one silicon-containing layer of the floating-gate layer and extending across a first portion of an edge of the tunnel dielectric layer; and a second silicon oxide layer formed on a sidewall of the trench and extending across a second portion of the edge of the tunnel dielectric layer;

wherein the first and second silicon oxide layers are two distinct layers; and wherein the first and second silicon oxide layers are in contact with the tunnel dielectric layer.

7. The memory device of claim 6, wherein the array of floating-gate memory cells are arranged and configured as an array type selected from the group consisting of a NAND array of floating-gate memory cells and a NOR array of floating-gate memory cells.

8. The memory device of claim 6, wherein the tunnel dielectric layer comprises a silicon oxide layer.

9. The memory device of claim 6, wherein the at least one silicon-containing layer is a first polysilicon layer formed overlying and adjoining the tunnel dielectric layer.

10. The memory device of claim 9, wherein the floating-gate layer further comprises a second polysilicon layer overlying and adjoining the first polysilicon layer.

11. A memory device, comprising:
an array of floating-gate memory cells; and
circuitry for control and/or access of the array of floating-gate memory cells;
wherein the at least one memory cell of the array of floating-gate memory cells comprises:
    a tunnel oxide layer overlying a silicon-containing semiconductor substrate and positioned between two isolation trenches formed in the semiconductor substrate;
    a floating-gate layer overlying the tunnel oxide layer, wherein the floating-gate layer comprises at least one polysilicon layer;
    an intergate dielectric layer overlying the floating-gate layer;
    a control gate layer overlying the intergate dielectric layer;
    layers of oxidized epitaxial polysilicon formed on opposing edges of the at least one polysilicon layer of the floating-gate layer and extending across a first portion of opposing edges of the tunnel oxide layer; and
    layers of oxidized epitaxial monocrystalline silicon formed on sidewalls of the trenches and extending across a second portion of the opposing edges of the tunnel oxide layer;
    wherein the layers of oxidized epitaxial polysilicon are distinct from the layers of oxidized epitaxial monocrystalline silicon; and
    wherein the layers of oxidized epitaxial polysilicon are in contact with the tunnel oxide layer and the layers of oxidized epitaxial monocrystalline silicon are in contact with the tunnel oxide layer.

12. The memory device of claim 11, wherein the array of floating-gate memory cells are arranged and configured as an array type selected from the group consisting of a NAND array of floating-gate memory cells and a NOR array of floating-gate memory cells.

13. An electronic system, comprising:
a processor; and
a memory device coupled to the processor, wherein the memory device comprises:
an array of floating-gate memory cells, at least one memory cell comprising:
    a tunnel dielectric layer overlying a silicon-containing semiconductor substrate and adjacent a trench formed in the semiconductor substrate;
    a floating-gate layer overlying the tunnel dielectric layer, wherein the floating-gate layer comprises at least one silicon-containing layer;
    an intergate dielectric layer overlying the floating-gate layer;
    a control gate layer overlying the intergate dielectric layer;
    a first silicon oxide layer formed on an edge of the at least one silicon-containing layer of the floating-gate layer and extending across a first portion of an edge of the tunnel dielectric layer; and
    a second silicon oxide layer formed on a sidewall of the trench and extending across a second portion of the edge of the tunnel dielectric layer;
    wherein the first and second silicon oxide layers are two distinct layers; and
    wherein the first and second silicon oxide layers are in contact with the tunnel dielectric layer; and
circuitry for control and/or access of the array of floating-gate memory cells.

14. The electronic system of claim 13, wherein the array of floating-gate memory cells are arranged and configured as an array type selected from the group consisting of a NAND array of floating-gate memory cells and a NOR array of floating-gate memory cells.

15. The electronic system of claim 13, wherein the tunnel dielectric layer comprises a silicon oxide layer.

16. The electronic system of claim 13, wherein the at least one silicon-containing layer is a first polysilicon layer formed overlying and adjoining the tunnel dielectric layer.

17. The electronic system of claim 16, wherein the floating-gate layer further comprises a second polysilicon layer overlying and adjoining the first polysilicon layer.

18. An electronic system, comprising:
a processor; and
a memory device coupled to the processor, wherein the memory device comprises:
an array of floating-gate memory cells, at least one memory cell comprising:
    a tunnel oxide layer overlying a silicon-containing semiconductor substrate and positioned between two isolation trenches formed in the semiconductor substrate;
    a floating-gate layer overlying the tunnel oxide layer, wherein the floating-gate layer comprises at least one polysilicon layer;
    an intergate dielectric layer overlying the floating-gate layer;
    a control gate layer overlying the intergate dielectric layer;
    layers of oxidized epitaxial polysilicon formed on opposing edges of the at least one polysilicon layer of the floating-gate layer and extending across a first portion of opposing edges of the tunnel oxide layer; and
    layers of oxidized epitaxial monocrystalline silicon formed on sidewalls of the trenches and extending across a second portion of the opposing edges of the tunnel oxide layer; and
    wherein the layers of oxidized epitaxial polysilicon are distinct from the layers of oxidized epitaxial monocrystalline silicon; and wherein the layers of oxidized epitaxial polysilicon are in contact with the tunnel oxide layer and the layers of oxidized epitaxial mono crystalline silicon are in contact with the tunnel oxide layer;

circuitry for control and/or access of the array of floating-gate memory cells.

19. The electronic system of claim 18, wherein the array of floating-gate memory cells are arranged and configured as an array type selected from the group consisting of a NAND array of floating-gate memory cells and a NOR array of floating-gate memory cells.

\* \* \* \* \*